United States Patent
Mistry et al.

(10) Patent No.: US 10,184,983 B2
(45) Date of Patent: Jan. 22, 2019

(54) INTERFACE INDEPENDENT TEST BOOT METHOD AND APPARATUS USING AUTOMATIC TEST EQUIPMENT

(71) Applicant: Intel IP Corporation, Santa Clara, CA (US)

(72) Inventors: Hemang Vinubhai Mistry, Bangalore (IN); Uwe Hildebrand, Fuerth (DE); Sebastian Hessel, Bochum (DE)

(73) Assignee: Intel IP Corporation, Santa Clara, CA (US)

( * ) Notice: Subject to any disclaimer, the term of this patent is extended or adjusted under 35 U.S.C. 154(b) by 50 days.

(21) Appl. No.: 15/612,785

(22) Filed: Jun. 2, 2017

(65) Prior Publication Data

US 2018/0348299 A1 Dec. 6, 2018

(51) Int. Cl.
*G01R 31/28* (2006.01)
*G01R 31/3177* (2006.01)
*G01R 31/317* (2006.01)

(52) U.S. Cl.
CPC ... *G01R 31/3177* (2013.01); *G01R 31/31703* (2013.01); *G01R 31/31715* (2013.01)

(58) Field of Classification Search
CPC .......... G01R 31/3177; G01R 31/31703; G01R 31/31715
USPC ....... 714/733–735, 741, 724, 28, 29, 30, 31, 714/32, 33, 34, 35
See application file for complete search history.

(56) References Cited

U.S. PATENT DOCUMENTS

| | | | | |
|---|---|---|---|---|
| 8,099,629 B2 * | 1/2012 | Feng | ................ | G01R 31/31719 714/27 |
| 8,538,720 B2 * | 9/2013 | Hsu | ..................... | G06F 11/2284 702/119 |
| 2011/0264957 A1 * | 10/2011 | Hsu | ......................... | G06F 1/26 714/32 |

* cited by examiner

*Primary Examiner* — Christine T. Tu
(74) *Attorney, Agent, or Firm* — Schwabe, Williamson & Wyatt, P.C.

(57) ABSTRACT

Computer device(s), apparatus(es), and methods enable and/or perform interface independent test boot of a System on Chip (SoC). A test Direct Memory Access hardware unit (test DMA) and an Automatic Test Equipment (ATE) hardware unit suspend a processor core of the SoC, download a test case, perform a seamless switch into functional mode of the SoC, and execute the downloaded test case. The test DMA may mediate between the ATE and internal memory in the SoC.

25 Claims, 6 Drawing Sheets

INTERFACE INDEPENDENT TEST BOOT METHOD AND APPARATUS USING AUTOMATIC TEST EQUIPMENT

FIELD

The present disclosure relates to a computing device, in particular to a method and apparatus to perform an interface independent functional test boot of a System on Chip (SoC) using Automatic Test Equipment (ATE) hardware.

BACKGROUND

System and functional tests are performed on SoC assemblies. For example, tests are performed to determine per part voltage scaling, to perform Radio-Frequency (RF) testing, to screen for specific use cases (low power modes, performance, etc.), and to reduce defective parts per million units produced, and the like. Many of such tests involve a functional test boot, in which the SoC is booted with instructions from boot Read-only Memory (ROM), a specific test case is downloaded to and executed from SoC internal memory, and the test case result is sent to ATE for evaluation.

Some existing ATE functional test methods require that the SoC have a specific type of memory interface, such as (but not limited to) interfaces associated with an embedded multimedia card (eMMC) and/or NAND gate flash memory (NAND FLASH). If a specific interface is used for testing, an ATE and test protocol may not be able to write a firmware test case to the internal memory in the SoC internal memory.

Use of a specific interface like eMMC or NAND FLASH may require customized boot ROM to handle test case download for ATE testing. However, developing custom boot ROM requires time and resources, developing customized boot ROM complicates and risks functional mode system boot, and failures of an SoC executing custom boot ROM connected to an ATE are difficult to debug.

Use of a specific interface also limits the test case size to the size of internal memory that test equipment can connect to, which may not be all of the memory of the SoC being tested.

In some functional test methods, the functional mode boot sequence of the SoC is not tested; rather, SoC is booted in test mode bypassing the critical mission mode boot sequence, resulting in test escapes.

Some existing ATE functional test methods may not be fully controlled by the ATE and may require handshake between the ATE and a central processing unit (CPU) and/or boot ROM during test case download and/or during the execution process. This can negatively impact test robustness and stability.

Figure 1:
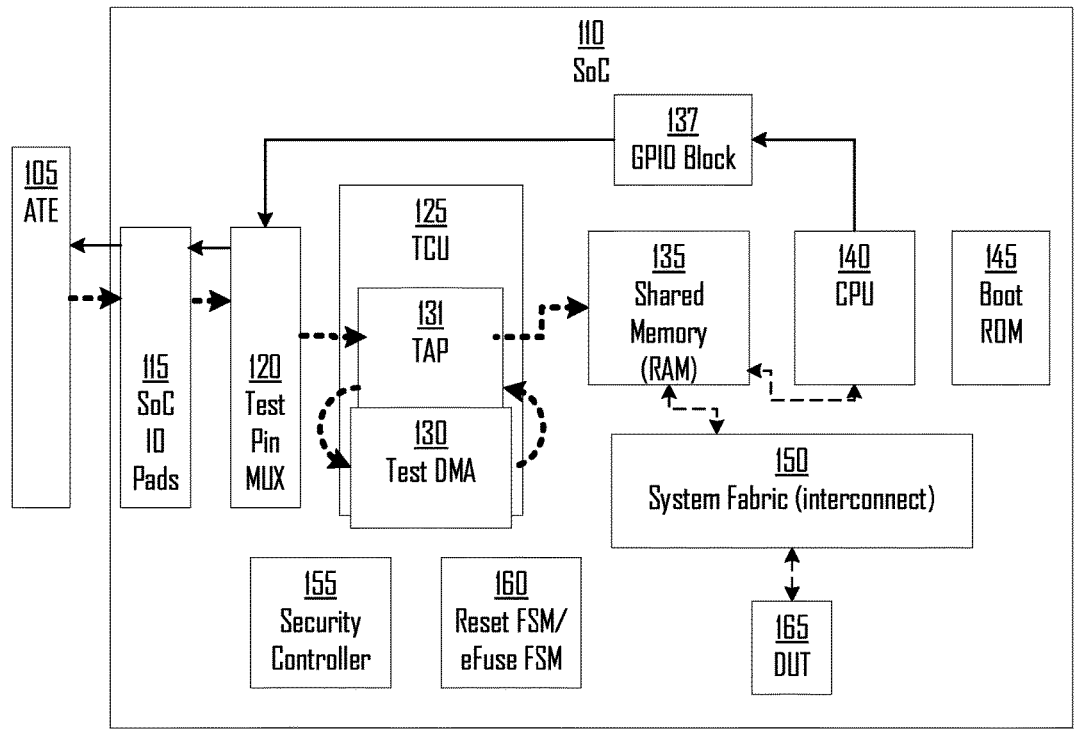
FIG. 1 is a device diagram illustrating a first system level view of an example of an ATE device, an SoC device, components thereof, and communication paths therein, consistent with embodiments of the present disclosure.
Figure 1:
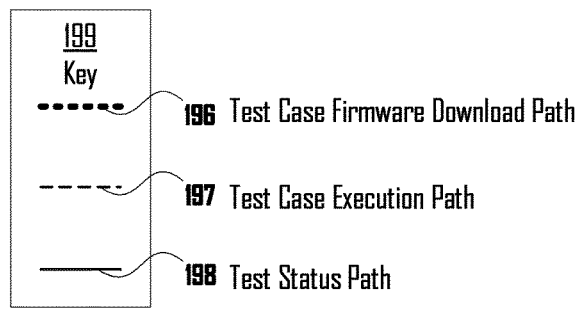

Although the following Detailed Description will proceed with reference being made to illustrative embodiments, many alternatives, modifications, and variations thereof will be apparent to those skilled in the art.

DETAILED DESCRIPTION

In overview of some embodiments, this disclosure relates to computer device(s), apparatus(es), and methods to enable and/or perform interface independent functional test boot of an SoC. The SoC may be coupled to a Device under Test (DUT); for example, a DUT may be a switch, solenoid, motor, wireless or wireline transceiver, or other device controlled by a processor of the SoC. The disclosed computer device(s), apparatus(es), and methods may comprise a Test Direct Memory Access (Test DMA) hardware and an ATE that suspend a CPU of the SoC, download a test case, perform a seamless switch into functional mode of the SoC, and cause a processor of the SoC to execute the downloaded test case, for example, to test the SoC and any connected DUT. The Test DMA may mediate between the ATE and internal memory in the SoC, both during download of the test case and during output of a result of execution of the test case.

The disclosed computer device(s), apparatus(es), and methods may not require a specific memory, such as eMMC or NAND FLASH, or a specific memory interface, unique to the memory. Instead, and as described further herein, the ATE and Test DMA may form a multiplex interface to allow ATE to multiplex onto General Purpose Input/Output (GPIO) pins of the SoC. A protocol is disclosed that may be controlled by the ATE. Download of the test case firmware may be managed by the ATE without need for a handshake between the ATE and the SoC. Execution of boot ROM code may cause a CPU of an SoC to detect a test boot flag and branch to the test boot location, without a large-overhead custom-made boot ROM.

The disclosed computer device(s), apparatus(es), and methods may scale to accommodate a wide number of GPIO pins to increase the speed of download of the test case. This may be particularly beneficial when a large test case needs to be loaded, for example, during test of an SoC's RF emission, reception, or susceptibility. The disclosed computer device(s), apparatus(es), and methods may also be used for functional boot screening, as main and reset finite state machines may be in a functional mode until a core processor of the SoC boots, at which point the boot process may branch to execute a downloaded test case.

The disclosed computer device(s), apparatus(es), and methods may be used by any SoC having GPIOs that can be re-purposed for testing in test mode conditions, e.g., using test Pad Control Logic (PCL). The disclosed Test DMA is fully configurable to use any width of ATE data bus (8, 16, 32, 64, . . . ) for download of test case firmware so as to match a test pin requirement (which may vary from product to product), with similar configuration flexibility with respect to internal memory data widths within the SoC. This may be configured, for example, through Register Transfer Language (RTL), including through libraries and/or a hardware description language that implement register-transfer logic with RTL. RTL is an intermediate representation, similar to assembly language, used to represent data flow in a register-transfer logic architecture (also referred to as "register transfer level"). Register-transfer logic is a type of architecture for digital logic circuits based on gates and registers.

The ATE may be used to download the test case firmware to any memory bank of an SoC that can be accessed and executed by a CPU of the SoC. Test case download and execution may be fully controlled by ATE through a test interface; the test interface may include a Test DMA that conforms with a Joint Test Action Group (JTAG) standard. The ATE may initiate a reset of the SoC and download the test case when the SoC system is in reset (when the reset is suspended). Both clock and data may be provided by the ATE during download of the test case. After the test case is downloaded, the SoC reset suspension can be released by the ATE with a write to one or more System Control Unit (SCU) registers or Test Data Registers (collectively referred to herein as TDRs); such registers may comply with the JTAG standard. Accordingly, the ATE may have control over download and initiation of execution of the test case, because the ATE may control suspension of reset/startup finite state machine(s) for the SoC.

The ATE, through a JTAG standard compliant interface, may write to the TDRs the location where the test case was downloaded to. This location may also be referred to herein as the test boot branch location.

Boot ROM code, which may be functional boot ROM code, may be executed after suspension and after download of the test case and after lift of the SoC reset. The boot ROM code may be modified, if at all, only to allow a fork to test mode. The TDR(s) containing the boot branch location may be latched at the time of booting and read by the boot ROM code, to initiate execution of the test case, which may test the SoC and any DUT. Unlike some legacy approaches, no hardcoding or fusing of the test boot branch is required.

Security can be implemented with respect to insertion of the Test DMA, for example, through enabling of the Test DMA through JTAG standards.

FIG. 1 is a device diagram illustrating a system level view of an example of an ATE device, an SoC device, components thereof, and communication paths therein, consistent with embodiments of the present disclosure.

Key 199 in FIG. 1 graphically identifies communication paths followed by Test Case Firmware Download Path 196, Test Case Execution Path 197, and Test Status Path 198. Test Case Firmware Download Path 196 is an example of a path of code for a test case downloaded to an SoC. Test Case Execution Path 197 is an example of a path of code during execution of the test case. Test Status Path 198 is an example of a path of data resulting from execution of the test case.

Test Case Firmware Download Path 196 starts with ATE 105. As noted, ATE is an ATE unit. In the context of semiconductors, ATE may be used to determine whether an SoC and/or a DUT function as designed, such as according to a result of execution of the test case. The ATE may comprise, for example, a master controller that synchronizes one or more source and capture instruments. The SoC and/or DUT may be physically connected to ATE 105 by a robotic handler or prober. ATE 105 may comprise data for a test case, to be downloaded to and executed by SoC 110 and DUT 165.

In FIG. 1, ATE 105 connects to SoC 110 at SoC IO Pads 115. SoC IO Pads 115 may be, for example, contact pads for forming electrical connection with an integrated circuit, such as SoC 110. ATE 105 connects to SoC IO Pads 115 to enable reset and reset suspension of SoC 110, to enable download of the test case to the SoC 110, to enable release of the reset suspension and execution of the test cast by CPU 140 of SoC 110, and to enable reading a result of execution of the test case. In the example illustrated in FIG. 1, SoC IO Pads 115 connect to Test Pin MUX 120, which may be a multiplexer, multiplexing the 10 pads to Timing and Control Unit (TCU) 125 and to a shared memory, such as shared RAM, Shared Memory 135. A multiplexer is a device that selects one of several analog or digital input signals and forwards the selected input to a single line. A demultiplexer performs the reverse process, taking a single input signal and selecting one of many data-output lines, connected to the single input. As used herein, "multiplexer" or "multiplexing" may refer to both a multiplexor and multiplexing and to a demultiplexor and demultiplexing.

FIG. 1 illustrates an example in which Test DMA 130 overlaps SoC 110 at TCU 125 and test access port (TAP) 131, along the path of Test Case Firmware Download Path 196. As noted, Test DMA 130 may be a hardware component that provides access to certain components of memory in SoC 110, independent of a CPU, such as CPU 140. Test DMA 130 may mediate logical connection between ATE 105, Shared Memory 135, and other components of SoC 110 and DUT 165. Test DMA 130 may be a permanent component of SoC 110 and/or may be a component, like ATE 105, connected to SoC 110 during testing. TCU 125 may be a component of SoC 110 that acts as an interface between CPU 140 and Shared Memory 135 and provides timing and control signals. TCU 125 may be an integral part of the CPU 140 or may be separate from the CPU 140. Test DMA 130 may utilize one or more test access ports in or of TAP 131, within TCU 125, to connect to TCU 125.

FIG. 1 illustrates use of GPIO pins, such as of SoC IO Pad 115, to connect ATE 105 and Text Pin MUX 120, and, via TCU 125 and TAP 131, to Test DMA 130 and onward to SoC 110 to perform the test functions described herein. As noted, test pin multiplexing may be performed by PCL generated at an ATE bus interface by Test DMA 130. In this way, the disclosed Test DMA may be configurable, such as through RTL, to use any width of ATE data bus (8, 16, 32, 64, . . . ) for download of test case firmware so as to match a test pin requirement or availability (which may vary from product to product), with similar configuration flexibility with respect to internal memory data widths within the SoC, such as toward Shared Memory 135. Test pin multiplexing may be done, for example, to transfer the test case firmware from ATE 105 into internal memory, such as Shared Memory 135, and to allow ATE 105 to set a test case flag and a location of the Shared Memory 135 to which the test case was downloaded. Multiplexing in this way allows download of the test case to all available memory in SoC 110, rather than just to a subset of memory. Multiplexing in this way also allows the download to proceed faster than it might otherwise, for example, if the bus connection between ATE 105 and Shared Memory 135 were constrained by a memory interface.

In conjunction with download of the test case from ATE 105 to Shared Memory 135, the location of test case and a test case flag may be set in TDRs by ATE 105. After download of the test case, the suspended reset condition may be released, for example, by ATE 105 writing a reset release signal to one or more TDRs. Release of the reset condition may cause CPU 140 to execute code from Boot ROM 145, which may cause a branch to execute the code of the test boot branch location. As discussed further herein, code from Boot ROM 145 may be functional boot ROM code. Code in Boot ROM 145 may be modified, if at all, only to allow a fork to test mode.

Following the example illustrated with respect to Test Case Execution Path 197, the test case firmware downloaded to Shared Memory 135 may be read by CPU 140 and executed, such as according to Boot ROM 145, in a test boot branch (as described further herein). This may result in interaction across System Fabric 150 (interconnect) with DUT 165 and other components of SoC 110, to test DUT 165, as well.

As illustrated by Test Status Path 198 in FIG. 1, the status of test case execution (error conditions, confirmations, etc.) can be provided to ATE 105 by means of writing to GPIO registers of or in GPIO Block 137, output of which may be mapped to functional GPIO ports of SoC IO Pads 115 through Test Pin MUX 120, for feedback back to ATE 105.

Security Controller 155 of FIG. 1 may ensure authentication of Test DMA 130 access to a test access port, such as to TAP 131, and/or TCU 125. Unauthorized access can be blocked by Security Controller 155. Security Controller 155 can be, for example, a DFx aggregator or a security block. Security Controller 155 may allow test case download if appropriate security keys are received before the boot process.

As discussed further herein, Finite State Machines (FSMs), such as Reset Finite State Machine (Reset FSM) 160, may be used to initiate reset of SoC 110 and to suspend the reset, pending download of the test case firmware. FSMs, such as Reset FSM 160, may comprise an efuse. As used herein, an "eFuse" or "efuse" is a computer component, generally "hard-coded" into a computer chip, that acts as a toggle, to reroute chip circuitry and logic, depending on the state of the efuse. Circuit paths are generally "etched" or hard-coded into a chip and cannot be changed after manufacture. One or more efuses may allow for circuit paths to be changed. For example, an efuse may connect a first path to one of a second or a third path, depending on the state of the efuse. In state "A," the efuse may connect the first path to the second path; in state "B," the efuse may connect the first path to the third path. The state of the efuse may be changed, including while a circuit is operating. An example of a process and circuits used to initiate and/or suspend a reset, including through use of an efuse controller, is discussed at greater length in relation to FIG. 3.

Figure 2:
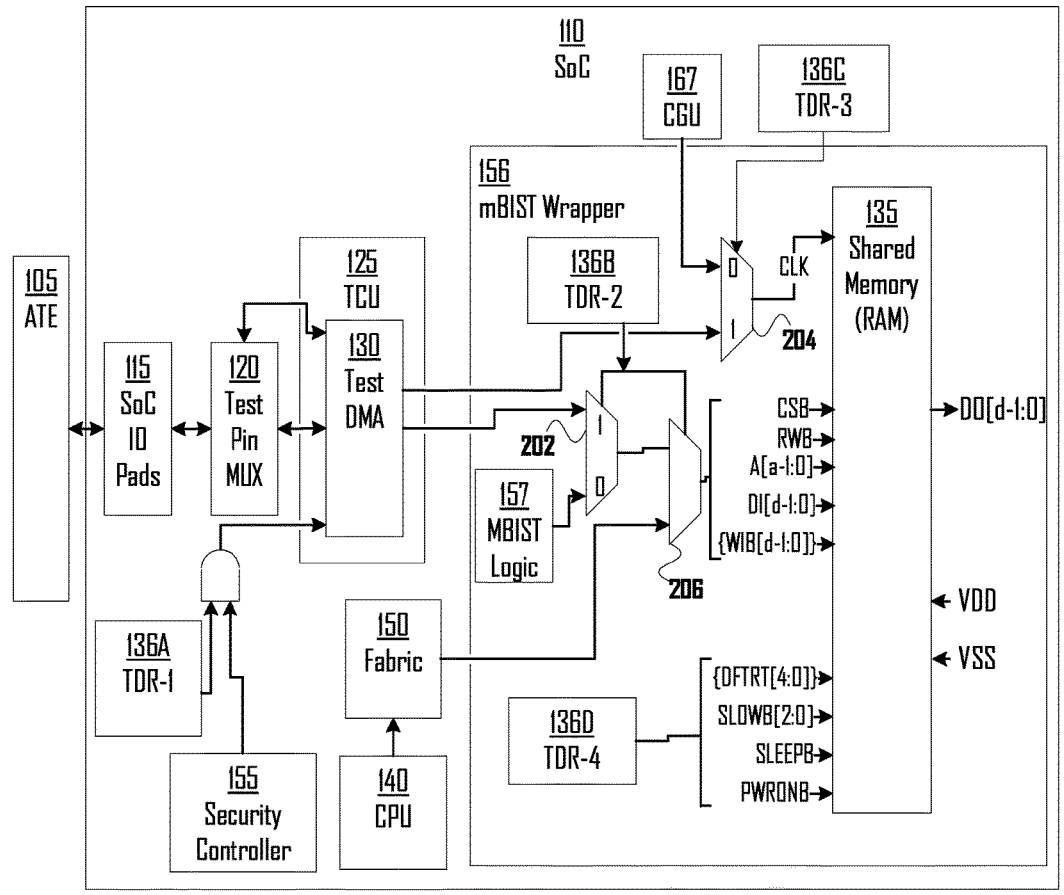
FIG. 2 is a device diagram illustrating a second system level view of an example of an ATE device, an SoC device, components thereof, and communication paths therein, consistent with embodiments of the present disclosure.

FIG. 2 illustrates ATE 105, Test DMA 130, SoC 110 and components thereof of FIG. 1. FIG. 2 also illustrates Memory Built-In Self Test (MBIST) Wrapper 156. MBIST Wrapper 156 or the equivalent may be a standard component or service of SoC 110 and may provide built-in self-test functions to SoC 110. For example, MBIST Wrapper 156 may be used, such as during reset and start-up, to confirm that all or part SoC 110 is operating as functionally designed. FIG. 2 illustrates additional details of SoC 110 in relation to initiation and suspension of reset of SoC 110, using MBIST Wrapper 156.

FIG. 2 illustrates multiple instances of TDR 136, TDR-1 136A, TDR-2 136B, TDR-3 136C, and TDR-4 136D. As noted elsewhere, the TDR(s) may be JTAG compliant test data register(s) which may be a register of a system control unit or SCU. MBIST Logic 157 in FIG. 2 may comprise, for example, instructions, code, firmware, and the like executed by or in MBIST Wrapper 156 upon the occurrence of conditions, such as conditions to trigger reset, startup, and suspension of startup, to confirm that SoC 110 is operating as functionally designed. Clock Generation Unit (CGU) 167 may generate a clock signal for all blocks or modules in SoC 110 during functional mode (operation of SoC 110 as intended).

FIG. 2 illustrates that data in TDRs, written by ATE 105 via Test DMA 130, with access controlled by Security Controller 155, interact with MBIST Logic 157 and CGU 167, via multiplexers 202, 204, and 206, to initiate a reset of SoC 110, set a clock used by Shared Memory 135 during download of the test case firmware from ATE 105, initiate a test mode of MBIST Wrapper 156, such as according to MBIST Logic 157, and then suspend CPU 140. While CPU 140 is suspended, ATE 105 and Test DMA 130 may download the test case firmware to Shared Memory 135.

Figure 3:
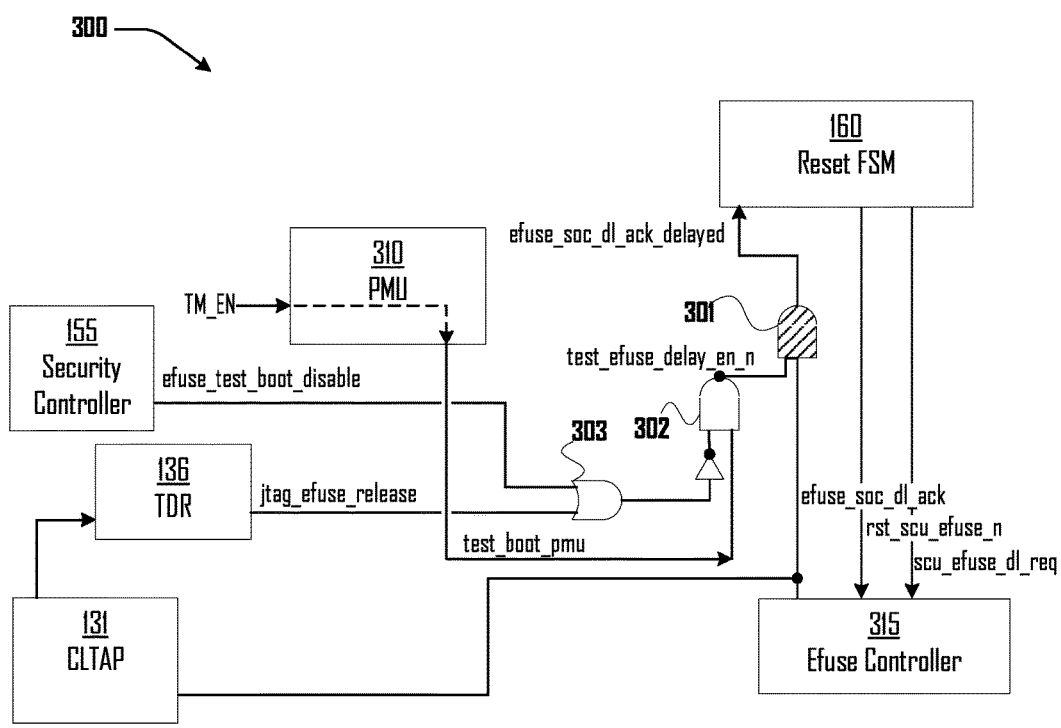
FIG. 3 is a functional block diagram illustrating an example of some components of a computer device practicing the present disclosure, consistent with embodiments of the present disclosure and illustrating logic and a circuit to suspend a reset finite state machine, pending download of a test case.

Once the test case firmware is downloaded, CPU 140 suspension is released and functional mode is triggered through another data signal (such as a jtag_efuse_release signal) written to TDR 136 by ATE 105 and Test DMA 130 (discussed further in relation to FIG. 3). This signal is written only once the test case firmware download is completed. Once jtag_efuse_release is written, the functional path of the memory inputs are enabled instead of test/MBIST paths and the test case can be executed according to, for example, a functional mode of the SoC 110.

The clock input to the memory from CGU 167 may require a glitch free multiplex connection at multiplexer 204 to ensure that when the switch from test mode to functional mode is triggered, the previously downloaded test case firmware is not corrupted. A glitch may occur because the test mode clock supplied by the ATE may be a relatively slow speed ATE clock, whereas the functional mode clock may be a high speed digital phase locked loop (DPLL) clock; these may be completely asynchronous relative to one another. It should be noted that the memory power management ports may be controlled by a JTAG compliant TDR during the test boot process. This ensures that no switch or toggle occurs relative to the power management ports of the memory, which might otherwise corrupt the downloaded test case firmware.

While one memory instance, Shared Memory 135, is shown in FIGS. 1 and 2, this may be scaled to multiple memory instances by applying decoding logic on the input side. In this way, one instance of Test DMA 130 can serve a full memory bank within a block. More than one Test DMA 130 block may download the test case firmware. Test DMA 130 may generate all necessary signals to control the test case firmware write into Shared Memory 135.

FIG. 3 is a functional block diagram illustrating an example of some components 300 of a computer device practicing the present disclosure, consistent with embodiments of the present disclosure. More specifically, FIG. 3 illustrates logic and circuitry to suspend Reset FSM 160. As discussed in relation to FIGS. 1-2, reset and suspension of reset by Reset FSM 160 may be performed to enable download of the test case to the memory in the SoC 110. A hardware circuit illustrated in FIG. 3, controlled by ATE 105, works with Efuse Controller 315 to intercept and delay an SoC boot process for the purpose of downloading a test case into shared memory during test boot mode. A method performed, in part, by the hardware circuit illustrated in FIG. 3 is discussed at greater length in relation to FIG. 4.

In addition to components illustrated and discussed in relation to other figures, FIG. 3 illustrates Efuse Controller

315. Efuse Controller 315 may control an efuse, such as one in, for example, Reset FSM/eFuse FSM 160 (in FIG. 1). Efuse Controller 315 may be, for example, a controller of an efuse, to change the efuse(s) state, which may be involved in rerouting circuit paths, which may be involved in, for example, reset suspension and/or releasing reset suspension. Efuse Controller 315 may be used in conjunction with logical AND gate 301, logical NAND gate 302, and logical OR gate 303 to suspend reset and/or release of reset suspension. Logical AND gate 301, logical NAND gate 302, and logical OR gate 303 gates may be designed into SoC.

With reference to FIG. 3, an SoC (not illustrated in FIG. 3) may be in a power-down state, with no power. The SoC may be brought into a power-on reset state by, for example, ATE 105. ATE 105 may assert an SoC Power ON reset pin and asynchronous assertion of all hardware block resets. ATE 105 may boot a power management unit. In FIG. 3, Reset FSM 160 may trigger Efuse Controller 315 to start an efuse sense and transfer process through signals rst_scu_efuse_n and scu_efuse_dl_req (scu efuse download request). Efuse sensing senses the state of an efuse, while efuse transfer transfers state information to the efuse.

Once the efuse transfer process is completed, Efuse Controller 315 asserts an efuse SoC download acknowledgement signal such as efuse_soc_dl_ack signal to indicate the completion of the efuse transfer process. This may suspend the reset condition.

The hardware circuit illustrated in FIG. 3 prevents the efuse_soc_dl_ack signal from traveling through logical AND gate 301 and reaching Reset FSM 160, thereby keeping SoC 110 in a suspended reset condition until the test case download is completed by ATE 105 through Test DMA 130. When the test case download is complete, ATE 105 may assert a signal (jtag_efuse_release) through TDR 136 to '1'. This signal (jtag_efuse_release) then propagates to logical OR gate 303 with a signal from Security Controller 155, efuse_test_boot_disable, and to logical NAND gate 302 via an inverter to generate signal test_efuse_delay_en_n. Since test_efuse_delay_en_n is asserted to "1," logical AND gate 301 will allow efuse_soc_dl_ack to propagate to Reset FSM 160.

Upon receiving the efuse_soc_dl_ack_delayed signal, Reset FSM 160 may advance to a next state (efuse_end) and may lift the reset of the CPU. The CPU may then execute the downloaded test case.

Logical AND gate 301 will be transparent for normal functional or mission mode; it blocks the efuse_soc_dl_ack signal only when TM_EN (Test Mode Enable) signal is asserted to "1," as may have been generated by ATE 105, via an SoC Power Management Unit (PMU) 310. A power management unit, such as PMU 310, is a unit to manage power to an SoC, including supply of power to turn the SoC on. PMU 310 may be able to transmit a signal to enable test mode, such as the TM_EN signal sent to an always-on (AON) domain of the SoC; the ATE 105 may be able to signal to the PMU 310 to transmit the test mode enablement signal. In addition to the ATE 105 messaging the PMU 310 to transmit the TM_EN signal to enable test mode, ATE 105 may also supply current and clock to boot the PMU 310 from a power-down state.

As discussed herein, an ATE controls a process to initiate startup, reset, and reset suspension. During reset suspension, the ATE downloads a test case to memory. After download of the test case to memory, the ATE releases reset suspension, triggers execution of the test case, and obtains a status of the execution. This process is controlled by the ATE and ensures the gates illustrated in FIG. 3 do not have any impact on normal functional mode, when TM_EN signal is not asserted.

With respect to Security Controller 155 in FIG. 3, Security Controller 155 can prevent the test case download through Test DMA 130 even in test mode with the help of logical OR gate 303. Logical OR gate 303 may be connected to a security device, such as Security Controller 155. Security Controller 155 may allow test case download if appropriate security keys are received before the boot process. Generally during a production test process, security may not be enabled; it may be enabled for customer samples, which can be unlocked with proper authorization as mentioned above.

Figure 4:
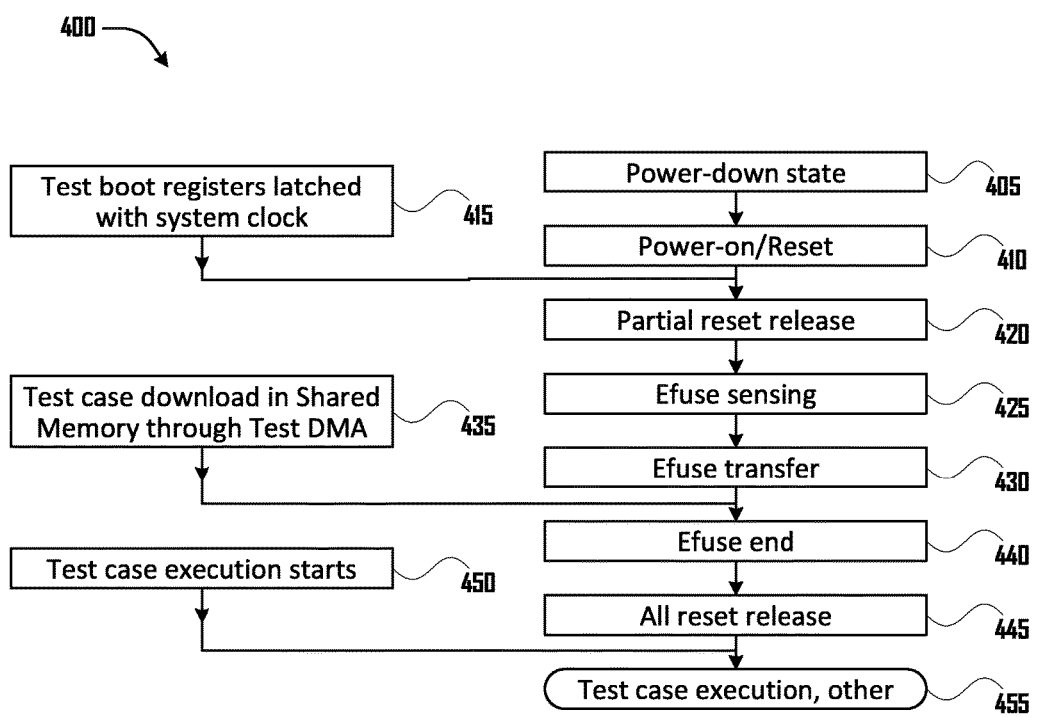
FIG. 4 is a flow diagram illustrating an example of an interface independent test boot method performed according to some embodiments of the present disclosure.

FIG. 4 is a flow diagram illustrating an example of an interface independent test boot method 400 performed according to some embodiments of the present disclosure, such as by a reset FSM.

At block 405, an SoC is in an SoC power-down state and no power is supplied to the SoC. At block 410, the SoC is brought into a power-on reset state by means of asserting an SoC Power ON reset pin. This may involve asynchronous assertion of all hardware block resets.

At block 415, post power-on reset test boot registers in SCU, also referred to herein as TDRs, start latching the value of test boot TDRs with a system clock (from a pin of the SoC, not CGU 167). These values may contain a test boot flag (indicating test boot mode) and a test boot address in the Shared Memory 135. These values may have been set, such as by ATE 105 through JTAG interface, as discussed in relation to FIGS. 1-3. The SCU/TDR registers are later, such as at block/state 445, read by boot ROM code to determine the reset condition and, once CPU 140 is released from reset, to branch to the test case location in Shared Memory 135.

At block 420, all power domains containing efuse registers are powered up and set out of reset for efuse sensing. This results in a partial reset release state where only efuse registers are set out of reset while all other hardware blocks are kept under reset. For example, referring to FIG. 3, rst_scu_efuse_n and scu_efuse_dl_req signals are sent to Efuse Controller 315 in this state/block. This triggers efuse sensing.

At block 425, efuse sensing is started and the Efuse Controller 315 starts reading the efuse values for efuse permanent storage and stores them into temporary registers within Efuse Controller 315.

At block 430, the values stored in Efuse Controller 315 temporary registers are transferred to actual efuse registers within every block requiring efuse functionality. Referring to FIG. 3, Efuse Controller 315 asserts efuse_soc_dl_ack signal toward logical AND gate 301.

At block 435, the ATE 105 transfers the test case into Shared Memory 135 with the help of Test DMA 130 while efuse_soc_dl_ack to reset FSM is blocked by the hardware circuit discussed in relation to FIG. 3. At the end of this state/block, and referring to FIG. 3, ATE 105 writes TDR 136 jtag_efuse_release to unblock the efuse_soc_dl_ack towards Reset FSM 160. As a result, Reset FSM 160 moves to efuse end state.

At block 440, the efuse transfer is completed, the test case has been downloaded in Shared Memory 135, and the efuse transfer done indication is sent to the main FSM, which may then switch off the Efuse Controller 315 to save power.

At block 445, the CPU 140 and other critical blocks of SoC 110 are set out of reset, which results in execution of boot ROM code, which further checks the test boot flag set in block 415. For example, execution of boot ROM code may check whether test boot mode, normal mode, or another mode (such as a memory patch mode) is to be followed.

At block 450, test case execution is started by CPU 140 execution of boot ROM after sensing the test boot request flag and test boot address in Shared Memory 135.

Following block 450, such as at block 455, upon sensing the test boot mode request, the boot ROM branches to the test boot address in Shared Memory 135, and the test case may be executed, with the CPU 140 sending message(s) to the ATE 105 through general purpose registers and GPIO, with the status of the test case execution (such as pass/fail, etc.).

As illustrated in FIG. 4, the test boot request and test boot branch location is written through an ATE 105 and latched into TDR-SCU internal registers right after SCU comes out of reset. This ensures that when CPU 140 is brought out of reset, it captures the test boot request and does not proceed further with functional boot ROM code. Rather it branches to the test boot location, per the test boot status registers and test boot address latched in TDR-SCU registers.

Figure 5:
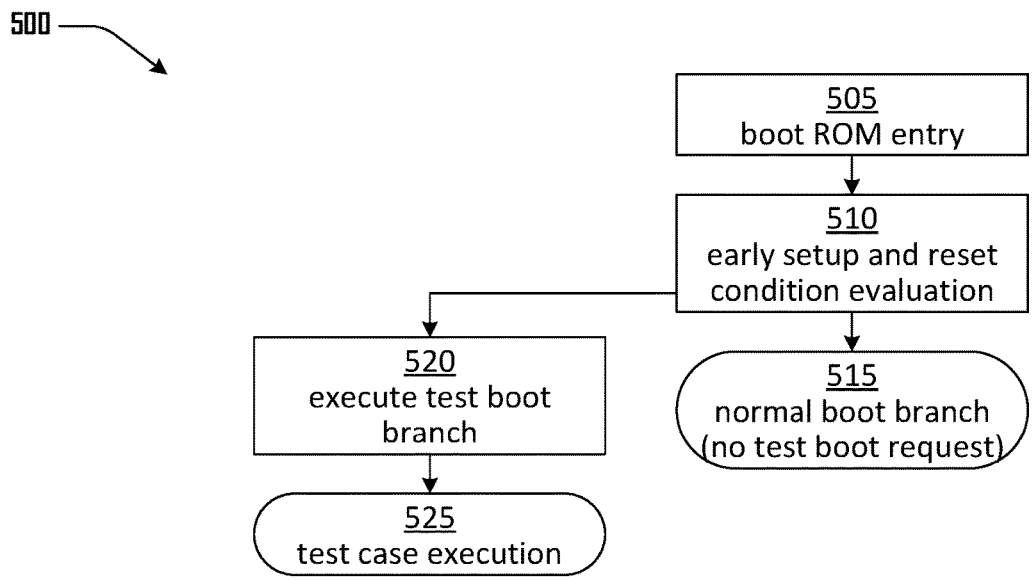
FIG. 5 is a flow diagram illustrating an example of boot branches available to an SoC device, according to some embodiments of the present disclosure.

FIG. 5 is a flow diagram illustrating an example of boot branches 500 available to an SoC, according to some embodiments of the present disclosure.

At block 505, a processor core of an SoC loads boot ROM and begins to execute it.

At block 510, execution by the processor core may be suspended and early setup and reset conditions are evaluated, such as based on the status of a test boot register, provided by the (JTAG compliant) TDR that can be read by boot ROM. If a test signal and test boot branch location are set in the TDR, such as by an ATE and Test DMA, the boot process may branch to block 520, where execution of test mode boot occurs, and to block 525, where the code of the test case is executed.

If no test mode is encountered at block 510, then at block 515 a normal boot branch may be followed, without test mode. Block 515 may lead to basic initialization and boot scenario evaluation and to activation of external boot interfaces.

Figure 6:
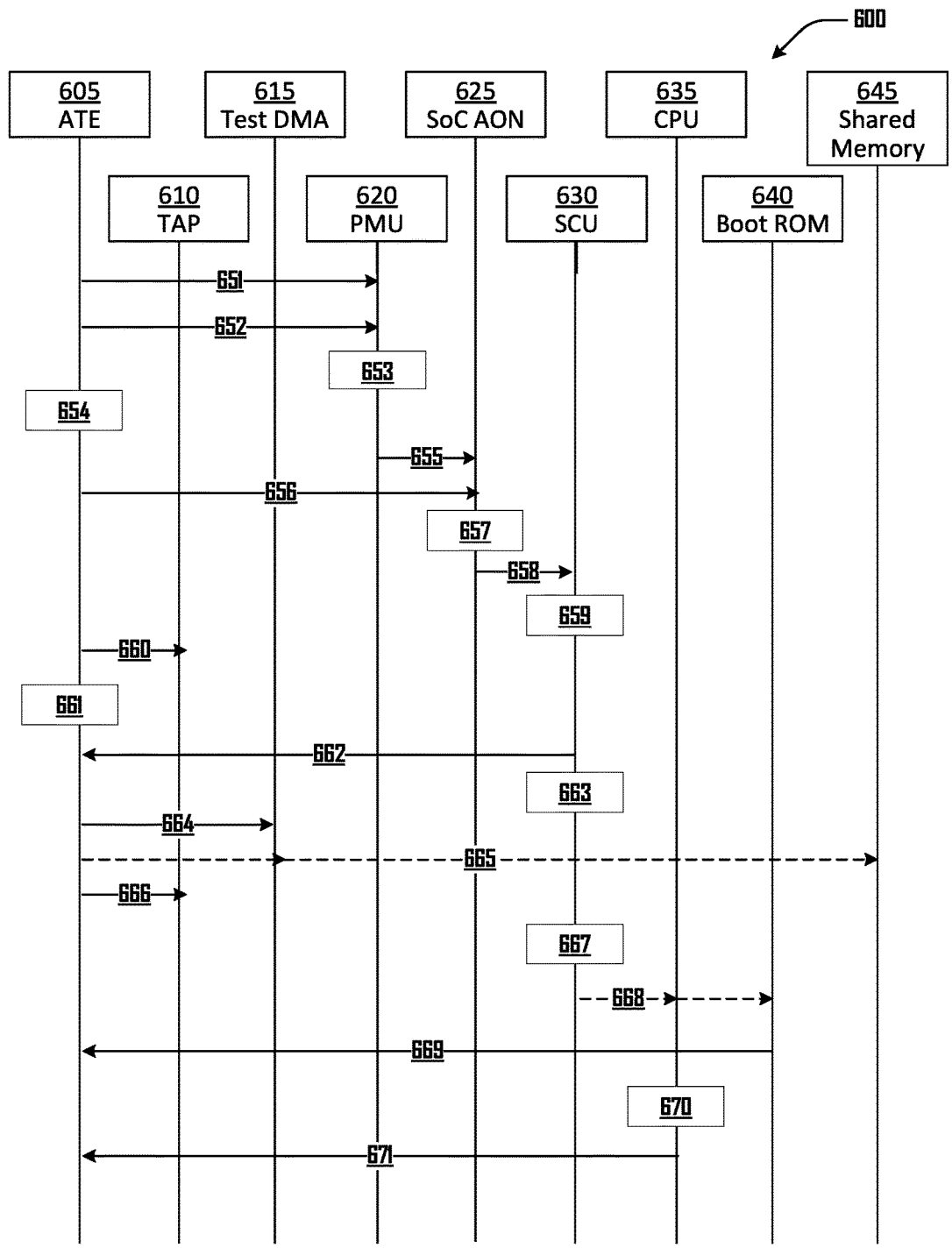
FIG. 6 is a message diagram illustrating an example of messages exchanged during an interface independent test boot method, according to some embodiments of the present disclosure.

FIG. 6 is a message diagram 600 illustrating an example of messages exchanged among ATE 605, test DMA 615, and components of SoC including Test Access Ports (TAP) 610, Power Management Unit (PMU) 620, an SoC always-on-power domain (SoC AON) 625, System Control Unit (SCU) 630, CPU 635, boot ROM 640, and Shared Memory 645, such as RAM, during an interface independent test boot method, according to some embodiments of the present disclosure. As noted, this may occur during test of an SoC and DUT, utilizing an ATE and test DMA.

At message 651, ATE 605 supplies current and clock to PMU 620, such as a signal comprising Vbat, 1.8 v, clk_32K. At message 652, ATE 605 instructs PMU 620 to enable test mode, such as via a signal comprising TM_EN.

At block 653, PMU 620 boots into test mode.

At block 654, ATE 605 forces all digital power supplies.

At message 655, PMU 620 sends a reset released or power-on message to a main startup FSM. The Main start-up FSM may be part of SoC AON 625; such message may be, for example, "soc_aon_pon".

At message 656, ATE 605 may establish a clock for SoC AON 625, such as, for example, a system clock.

At block 657, SoC AON 625 and main startup FSM may power up the SoC top power domain of the SoC, which may contain the SCU.

At message 658, SoC AON 625 may send a message to a reset FSM, such as in SCU 630, to start.

At block 659, the reset FSM may start.

At message 660, ATE 605 may send a message to configure functional test mode to a test pin multiplexer through a test access port, TAP 610.

At block 661, ATE 605 may determine the multiplexer configuration for the shared memory (for example, as discussed in relation to FIGS. 1 and 2 and multiplexers 202, 204, and 206), may request test boot, and may configure the test boot branch address.

At message 662, efuse FSM sends the efuse status, such as in FIG. 4 and block 430, after which the test case transfer may start.

At block 663, scu 630 and reset FSM may enter a halt state because JTAG efuse release is set to zero.

At message 664, ATE 605 may send a message to Test DMA, Test DMA 615, to de-assert the reset of Test DMA through a JTAG TDR.

Message 665 is dotted to indicate that it may comprise two messages, one from ATE 605 to Test DMA 615 and another from Test DMA 615 to RAM, shared, or other internal memory in SoC, Shared Memory (RAM) 645. Message 665 comprises download of test case firmware to the shared memory.

At message 666, following download of test case firmware to the shared memory, ATE 605 may ungate the test data register, such as message jtag_efuse_release in FIG. 3, via a message to test access port, TAP 610.

At block 667, the reset FSM in SCU 630 may resume.

Message 668 is dotted to indicate that it may comprise two messages, one from SCU 630 to a central processor unit of the SoC, CPU 635, and one from CPU 635 to boot ROM 640. Message 668 may de-assert reset of CPU 635 and CPU 635 starts executing boot ROM code from boot ROM 640.

Message 669 from boot ROM 640 to ATE 605 may indicate that the test boot branch flag has been acknowledged by boot ROM 640.

At block 670, CPU 635 may execute the test case firmware from the test boot address location in shared memory.

At message 671, CPU 635 may send a message to ATE 605 with status of execution of the test case firmware.

FIG. 6 shows the boot process starting from system power up until test case firmware download, followed by execution. The switch from test case download state (during which time the test case firmware is downloaded) to test case execution state is triggered through (JTAG) TDR (jtag_efuse_release in this case). The TDR is written only once the test case firmware download is completed.

Control of start and end of download of test case firmware by a JTAG compliant ATE allows the ATE to control test case progression.

At the end of execution of the test case firmware by the CPU, the test case flags the status of test case execution by pulsing GPIO pins assigned, for example, by Test DMA 615 in cooperation with ATE 605.

As used in any embodiment herein, the term "logic" may refer to the logic of the instructions of an app, software, and/or firmware, and/or the logic embodied into a programmable circuitry by a configuration bit stream, to perform any of the aforementioned operations. Software may be embodied as a software package, code, instructions, instruction sets and/or data recorded on non-transitory computer readable storage medium. Firmware may be embodied as code, instructions or instruction sets and/or data that are hardcoded (e.g., nonvolatile) in memory devices.

"Circuitry," as used in any embodiment herein, may comprise, for example, singly or in any combination, hardwired circuitry, programmable circuitry such as Field Programmable Gate Array (FPGA). The logic may, collectively or individually, be embodied as circuitry that forms part of a larger system, for example, an integrated circuit (IC), an Application-Specific Integrated Circuit (ASIC), an SoC, desktop computers, laptop computers, tablet computers, servers, smartphones, etc.

As used herein, the term "module" (or "logic") may refer to, be part of, or include an ASIC, an SoC, an electronic circuit, a programmed programmable circuit (such as FPGA), a processor (shared, dedicated, or group) and/or memory (shared, dedicated, or group) or another computer hardware component or device that executes one or more software or firmware programs having executable machine instructions (generated from an assembler and/or a compiler) or a combination, a combinational logic circuit, and/or other suitable components with logic that provide the described functionality. Modules may be distinct and independent components integrated by sharing or passing data, or the modules may be subcomponents of a single module, or be split among several modules. The components may be processes running on, or implemented on, a single compute node or distributed among a plurality of compute nodes running in parallel, concurrently, sequentially or a combination, as described more fully in conjunction with the flow diagrams in the figures.

As used herein, a process corresponds to an instance of a program, e.g., an application program, executing on a processor and a thread corresponds to a portion of the process. A processor may include one or more execution core(s). The processor may be configured as one or more socket(s) that may each include one or more execution core(s).

Following are examples:

Example 1

A computer apparatus to test a computer System on Chip (SoC), comprising: an Automatic Test Equipment (ATE) hardware, wherein the ATE is to: engage and suspend a boot process of a processor core of the SoC; in a Test Data Register (TDR) accessible to a boot Read-only Memory (ROM) code, set a test boot flag and an address of a memory of the SoC; while the boot process of the processor core of the SoC is suspended, download a test case to the memory of the SoC; and after download of the test case, re-engage the boot process of the processor core of the SoC, whereupon, pursuant to the boot ROM code and the test boot flag, the processor core of the SoC is to follow the address to the memory of the SoC to obtain the test case and is to execute the test case.

Example 2

The apparatus according to Example 1, wherein the apparatus further comprises a Test Direct Memory Access Block (test DMA) to mediate between the ATE and the memory of the SoC, wherein the ATE and test DMA are further to form a multiplex interface to multiplex signals from the ATE through General Purpose Input/Output (GPIO) pins on the SoC, wherein the signals are to set the test boot flag and the address of the memory of the SoC in the TDR and are to download the test case to the memory of the SoC.

Example 3

The apparatus according to Example 2, wherein a width of an ATE data bus and a width of a memory data bus of the test DMA are configured through register transfer language.

Example 4

The apparatus according to Example 2, wherein to form the multiplex interface comprises to multiplex the signals according to Pad Control Logic (PCL) generated at an ATE bus interface by the test DMA.

Example 5

The apparatus according to Example 1, wherein to engage and suspend the boot process of the processor core of the SoC comprises to initiate a reset Finite State Machine (reset FSM) to initiate a reset state and to engage the processor core of the SoC, and wherein the reset FSM is prevented from advancing out of the reset state to engage the processor core of the SoC by the test boot flag.

Example 6

The apparatus according to Example 5, further comprising a circuit controlled by the ATE to prevent the reset FSM from advancing out of the reset state, wherein the circuit controlled by the ATE is to prevent the reset FSM from advancing out of the reset state until the ATE transmits a test case download completed flag to the circuit controlled by the ATE.

Example 7

The apparatus according to Example 6, wherein after download of the test case, the ATE is to transmit the test case download completed flag to the circuit controlled by the ATE, wherein the test case download completed flag is to cause the circuit controlled by the ATE to release an efuse load done indication to the reset FSM, wherein release of the efuse load done indication is to cause the reset FSM to advance out of the reset state and is to cause the processor core of the SoC to be re-engaged in the boot process.

Example 8

The apparatus according to Example 5, wherein to initiate the reset FSM comprises to initiate a main startup Finite State Machine (main startup FSM), wherein the main startup FSM is to cause initiation of the reset FSM.

Example 9

The apparatus according to Example 1, wherein the apparatus comprises a test Direct Memory Access (test DMA) block to mediate between the ATE and the memory of the SoC, wherein to download the test case to the memory of the SoC while the boot process of the SoC is suspended includes to transmit the test case from the ATE to the test DMA according to a width of a memory data bus of the memory of the SoC.

Example 10

The apparatus according to one or more of Example 1 to Example 9, wherein the test case is to be stored in the memory of the SoC without a handshake between the ATE and the SoC.

Example 11

The apparatus according to one or more of Example 1 to Example 9, wherein a clock of the memory of the SoC is to be controlled by the ATE during download of the test case to the memory of the SoC and wherein the clock of the memory of the SoC is to be controlled by a functional clock of the SoC during execution of the test case by the processor core of the SoC.

Example 12

The apparatus according to one or more of Example 1 to Example 9, wherein the SoC comprises a security controller, wherein the security controller is to secure communication between the ATE and the memory of the SoC according to a Joint Test Action Group (JTAG) testing standard.

Example 13

The apparatus according to one or more of Example 1 to Example 9, wherein the TDR is to comply with a Joint Test Action Group (JTAG) testing standard.

Example 14

The apparatus according to one or more of Example 1 to Example 9, wherein the apparatus is to cause the processor core of the SoC to write an output of the execution of the test case to GPIO pins of the SoC.

Example 15

A method to test a computer System on a Chip (SoC), comprising: with an Automatic Test Equipment (ATE) hardware, engaging and suspending a boot process of a processor core of the SoC; setting a test boot flag and an address of a memory of the SoC in a Test Data Register (TDR) accessible to a boot ROM code; downloading a test case to the memory of the SoC while the boot process of the processor core of the SoC is suspended; after downloading the test case, re-engaging the boot process of the processor core of the SoC, whereupon, pursuant to the boot ROM code and the test boot flag, the processor core of the SoC is to detect the test boot flag, follow the address to obtain the test case, and execute the test case.

Example 16

The method according to Example 15, further comprising, with a test direct memory access block (test DMA), forming a multiplex interface to multiplex signals from the ATE through General Purpose Input/Output (GPIO) pins on the SoC, wherein the signals are to set the test boot flag and the address of the memory of the SoC in the TDR and are to download the test case to the memory of the SoC.

Example 17

The method according to Example 16, further comprising configuring a width of an ATE data bus and a width of a memory data bus of the test DMA through a register transfer language.

Example 18

The method according to Example 16, further comprising generating pad control logic (PCL) at an ATE bus interface with the test DMA and using the PCL to form the multiplex interface.

Example 19

The method according to Example 15, wherein engaging and suspending the boot process of the SoC comprises initiating a reset Finite State Machine (reset FSM) to initiate a reset state of the processor core of the SoC, and preventing the reset FSM from advancing out of reset to re-engage the boot process of the processor core of the SoC with the test boot flag until after the test case is downloaded.

Example 20

The method according to Example 19, wherein after downloading the test case, transmitting by the ATE a test case download completed flag to a circuit controlled by the ATE, wherein the test case download completed flag is to cause the circuit controlled by the ATE to release an efuse load done indication to the reset FSM, wherein release of the efuse load done indication is to cause the reset FSM to advance out of the reset state and is to cause the processor core of the SoC to be re-engaged in the boot process.

Example 21

The method according to Example 19, wherein initiating the reset FSM comprises initiating a main startup Finite State Machine (main startup FSM), wherein the main startup FSM is to cause initiation of the reset FSM.

Example 22

The method according to Example 15, further comprising, with a test direct memory access block (test DMA), mediating between the ATE and the memory of the SoC, wherein to download the test case to the memory of the SoC while the boot process of the SoC is suspended includes to transmit the test case from the ATE to the test DMA according to a width of a memory data bus of the memory of the SoC.

Example 23

The method according to one or more of Example 15 to Example 22, further comprising storing the test case in the memory of the SoC without a handshake between the ATE and the SoC.

Example 24

The method according to one or more of Example 15 to Example 22, further comprising controlling a clock of the memory of the SoC with the ATE during download of the test case to the memory of the SoC and controlling the clock of the memory of the SoC with a functional clock of the SoC during execution of the test case by the processor core of the SoC.

Example 25

The method according to one or more of Example 15 to Example 22, further comprising securing communication between the ATE and the memory of the SoC with a security controller according to a Joint Test Action Group (JTAG) testing standard.

Example 26

The method according to one or more of Example 15 to Example 22, wherein the TDR is to comply with a Joint Test Action Group (JTAG) testing standard.

Example 27

The method according to one or more of Example 15 to Example 22, further comprising receiving by the ATE an output of execution of the test case at GPIO pins of the SoC.

Example 28

A computer apparatus to test a computer System on Chip (SoC), comprising: Automatic Test Equipment (ATE) hardware, which includes: means to engage and suspend a boot process of a processor core of the SoC; means to set a test boot flag and an address of a memory of the SoC in a test data register (TDR) accessible to a boot Read-only Memory (boot ROM) code; means to download a test case to the memory of the SoC while the boot process of the processor core of the SoC is suspended; and means to re-engage the boot process of the processor core of the SoC, after download of the test case, whereupon, pursuant to the boot ROM code and the test boot flag, the processor core of the SoC is to follow the address to the memory of the SoC and execute the test case.

Example 29

The apparatus according to Example 28, wherein the apparatus further comprises a test Direct Memory Access (test DMA) block, wherein the test DMA comprises means to mediate between the ATE and the memory of the SoC comprising means to form a multiplex interface to multiplex signals from the ATE through General Purpose Input/Output (GPIO) pins on the SoC, and further comprising means for the signals to set the test boot flag and the address of the memory of the SoC in the TDR and means for the signals to download the test case to the memory of the SoC.

Example 30

The apparatus according to Example 29, wherein means to mediate between the ATE and the memory of the SoC comprising means to configure a width of an ATE data bus and a width of a memory data bus of the test DMA through a register transfer language.

Example 31

The apparatus according to Example 29, wherein means to form the multiplex interface comprises means to generate Pad Control Logic (PCL) at an ATE bus interface with the test DMA.

Example 32

The apparatus according to Example 28, wherein means to engage and suspend the boot process of the processor core of the SoC further comprises means to initiate a reset finite state machine (reset FSM) to initiate a reset state and to engage the processor core of the SoC, and further comprising means for the test boot flag to prevent the reset FSM from advancing out of the reset state to engage the processor core of the SoC.

Example 33

The apparatus according to Example 32, further comprising means for a circuit controlled by the ATE to prevent the reset FSM from advancing out of the reset state, wherein the circuit controlled by the TDR comprises means to prevent the reset FSM from advancing out of the reset state until the ATE transmits a test case download completed flag to the circuit controlled by the ATE.

Example 34

The apparatus according to Example 33, wherein after download of the test case, the ATE comprises means to transmit the test case download completed flag to the circuit controlled by the ATE, wherein the test case download completed flag is to cause the circuit controlled by the ATE to release an efuse load done indication to the reset FSM, wherein release of the efuse load done indication is to cause the reset FSM to advance out of the reset state and cause the processor core of the SoC to be re-engaged in the boot process.

Example 35

The apparatus according to Example 33, wherein the means to initiate the reset FSM comprises means to initiate a main startup Finite State Machine (main startup FSM), wherein the main startup FSM comprises means to cause initiation of the reset FSM.

Example 36

The apparatus according to Example 28, wherein the apparatus comprises a test Direct Memory Access (test DMA) block, wherein the test DMA comprises means to mediate between the ATE and the memory of the SoC, wherein to download the test case to the memory of the SoC while the boot process of the SoC is suspended includes to transmit the test case from the ATE to the test DMA according to a width of a memory data bus of the memory of the SoC.

Example 37

The apparatus according to one or more of Example 28 to Example 36, further comprising means to store the test case in the memory of the SoC without a handshake between the ATE and the SoC.

Example 38

The apparatus according to one or more of Example 28 to Example 36, further comprising means to control a clock of the memory of the SoC during download of the test case to the memory of the SoC and means to control the clock of the memory of the SoC with a functional clock of the SoC during execution of the test case by the processor core of the SoC.

Example 39

The apparatus according to one or more of Example 28 to Example 36, further comprising means to secure communication between the ATE and the memory of the SoC with a security controller according to a Joint Test Action Group (JTAG) testing standard.

Example 40

The apparatus according to one or more of Example 28 to Example 36, further comprising means for the TDR to comply with a Joint Test Action Group (JTAG) testing standard.

Example 41

The apparatus according to one or more of Example 28 to Example 36, further comprising means for the processor core of the SoC to write an output of execution of the test case to GPIO pins of the SoC.

The invention claimed is:

1. A computer apparatus to test a computer System on Chip (SoC), comprising:
   an Automatic Test Equipment (ATE) hardware, wherein the ATE is to:
   engage and suspend a boot process of a processor core of the SoC;
   in a Test Data Register (TDR) accessible to a boot Read-only Memory (ROM) code, set a test boot flag and an address of a memory of the SoC;
   while the boot process of the processor core of the SoC is suspended, download a test case to the memory of the SoC; and
   after download of the test case, re-engage the boot process of the processor core of the SoC, whereupon, pursuant to the boot ROM code and the test boot flag, the processor core of the SoC is to follow the address to the memory of the SoC to obtain the test case and is to execute the test case.

2. The apparatus according to claim 1, wherein the apparatus further comprises a test Direct Memory Access (test DMA) block to mediate between the ATE and the memory of the SoC, wherein the ATE and test DMA are further to form a multiplex interface to multiplex signals from the ATE through General Purpose Input/Output (GPIO) pins on the SoC, wherein the signals are to set the test boot flag and the address of the memory of the SoC in the TDR and are to download the test case to the memory of the SoC.

3. The apparatus according to claim 2, wherein to form the multiplex interface comprises to multiplex the signals according to Pad Control Logic (PCL) generated at an ATE bus interface by the test DMA.

4. The apparatus according to claim 1, wherein to engage and suspend the boot process of the processor core of the SoC comprises to initiate a reset Finite State Machine (reset FSM) to initiate a reset state and to engage the processor core of the SoC, and wherein the reset FSM is prevented from advancing out of the reset state to engage the processor core of the SoC by the test boot flag.

5. The apparatus according to claim 4, further comprising a circuit controlled by the ATE to prevent the reset FSM from advancing out of the reset state, wherein the circuit controlled by the ATE is to prevent the reset FSM from advancing out of the reset state until the ATE transmits a test case download completed flag to the circuit controlled by the ATE.

6. The apparatus according to claim 5, wherein after download of the test case, the ATE is to transmit the test case download completed flag to the circuit controlled by the ATE, wherein the test case download completed flag is to cause the circuit controlled by the ATE to release an efuse load done indication to the reset FSM, wherein release of the efuse load done indication is to cause the reset FSM to advance out of the reset state and is to cause the processor core of the SoC to be re-engaged in the boot process.

7. The apparatus according to claim 1, wherein the apparatus comprises a test Direct Memory Access (test DMA) block to mediate between the ATE and the memory of the SoC, wherein to download the test case to the memory of the SoC while the boot process of the SoC is suspended includes to transmit the test case from the ATE to the test DMA according to a width of a memory data bus of the memory of the SoC.

8. The apparatus according to claim 1, wherein the test case is to be stored in the memory of the SoC without a handshake between the ATE and the SoC.

9. The apparatus according to claim 1, wherein a clock of the memory of the SoC is to be controlled by the ATE during download of the test case to the memory of the SoC and wherein the clock of the memory of the SoC is to be controlled by a functional clock of the SoC during execution of the test case by the processor core of the SoC.

10. The apparatus according to claim 1, wherein the apparatus is to cause the processor core of the SoC to write an output of the execution of the test case to general purpose input/output (GPIO) pins of the SoC.

11. A method to test a computer System on Chip (SoC), comprising:
    with an Automatic Test Equipment (ATE) hardware, engaging and suspending a boot process of a processor core of the SoC;
    setting a test boot flag and an address of a memory of the SoC in a Test Data Register (TDR) accessible to a boot Read-only Memory (ROM) code;
    downloading a test case to the memory of the SoC while the boot process of the processor core of the SoC is suspended;
    after downloading the test case, re-engaging the boot process of the processor core of the SoC, whereupon, pursuant to the boot ROM code and the test boot flag, the processor core of the SoC is to detect the test boot flag, follow the address to obtain the test case, and execute the test case.

12. The method according to claim 11, further comprising, with a test direct memory access block (test DMA), forming a multiplex interface to multiplex signals from the ATE through General Purpose Input/Output (GPIO) pins on the SoC, wherein the signals are to set the test boot flag and the address of the memory of the SoC in the TDR and are to download the test case to the memory of the SoC.

13. The method according to claim 11, wherein engaging and suspending the boot process of the SoC comprises initiating a reset Finite State Machine (reset FSM) to initiate a reset state of the processor core of the SoC, and preventing the reset FSM from advancing out of reset to re-engage the boot process of the processor core of the SoC with the test boot flag until after the test case is downloaded.

14. The method according to claim 13, wherein after downloading the test case, transmitting by the ATE a test case download completed flag to a circuit controlled by the ATE, wherein the test case download completed flag is to cause the circuit controlled by the ATE to release an efuse load done indication to the reset FSM, wherein release of the efuse load done indication is to cause the reset FSM to advance out of the reset state and is to cause the processor core of the SoC to be re-engaged in the boot process.

15. The method according to claim 11, further comprising controlling a clock of the memory of the SoC with the ATE during download of the test case to the memory of the SoC and controlling the clock of the memory of the SoC with a functional clock of the SoC during execution of the test case by the processor core of the SoC.

16. The method according to claim 11, further comprising receiving by the ATE an output of execution of the test case at General Purpose Input/Output (GPIO) pins of the SoC.

17. A computer apparatus to test a computer System on Chip (SoC), comprising:
Automatic Test Equipment (ATE) hardware, which includes:
means to engage and suspend a boot process of a processor core of the SoC;
means to set a test boot flag and an address of a memory of the SoC in a Test Data Register (TDR) accessible to a boot Read-only Memory (ROM) code;
means to download a test case to the memory of the SoC while the boot process of the processor core of the SoC is suspended; and
means to re-engage the boot process of the processor core of the SoC, after download of the test case, whereupon, pursuant to the boot ROM code and the test boot flag, the processor core of the SoC is to follow the address to the memory of the SoC and execute the test case.

18. The apparatus according to claim 17, wherein the apparatus further comprises a test Direct Memory Access (test DMA) block, wherein the test DMA comprises means to mediate between the ATE and the memory of the SoC comprising means to form a multiplex interface to multiplex signals from the ATE through General Purpose Input/Output (GPIO) pins on the SoC, and further comprising means for the signals to set the test boot flag and the address of the memory of the SoC in the TDR and means for the signals to download the test case to the memory of the SoC.

19. The apparatus according to claim 18, wherein means to form the multiplex interface comprises means to generate Pad Control Logic (PCL) at an ATE bus interface with the test DMA and means to form the multiplex interface using the PCL.

20. The apparatus according to claim 17, wherein means to engage and suspend the boot process of the processor core of the SoC further comprises means to initiate a reset Finite State Machine (reset FSM) to initiate a reset state and to engage the processor core of the SoC, and further comprising means for the test boot flag to prevent the reset FSM from advancing out of the reset state to engage the processor core of the SoC.

21. The apparatus according to claim 20, further comprising means for a circuit controlled by the ATE to prevent the reset FSM from advancing out of the reset state, wherein the circuit controlled by the TDR comprises means to prevent the reset FSM from advancing out of the reset state until the ATE transmits a test case download completed flag to the circuit controlled by the ATE.

22. The apparatus according to claim 21, wherein after download of the test case, the ATE comprises means to transmit the test case download completed flag to the circuit controlled by the ATE, wherein the test case download completed flag is to cause the circuit controlled by the ATE to release an efuse load done indication to the reset FSM, wherein release of the efuse load done indication is to cause the reset FSM to advance out of the reset state and cause the processor core of the SoC to be re-engaged in the boot process.

23. The apparatus according to claim 17, further comprising means to control a clock of the memory of the SoC during download of the test case to the memory of the SoC and means to control the clock of the memory of the SoC with a functional clock of the SoC during execution of the test case by the processor core of the SoC.

24. The apparatus according to claim 17, further comprising means to secure communication between the ATE and the memory of the SoC with a security controller according to a Joint Test Action Group (JTAG) testing standard.

25. The apparatus according to claim 17, further comprising means for the processor core of the SoC to write an output of execution of the test case to General Purpose Input/Output (GPIO) pins of the SoC.

* * * * *